United States Patent [19]
Kobayashi

[11] Patent Number: 5,757,700
[45] Date of Patent: May 26, 1998

[54] SEMICONDUCTOR MEMORY DEVICE

[75] Inventor: Yasuhiro Kobayashi, Gifu, Japan

[73] Assignee: Sanyo Electric Co., Ltd., Osaka, Japan

[21] Appl. No.: 805,504

[22] Filed: Feb. 26, 1997

[30] Foreign Application Priority Data

Feb. 29, 1996 [JP] Japan .................................. 8-042868

[51] Int. Cl.⁶ .................................................. G11C 13/00
[52] U.S. Cl. .............................. 365/189.01; 365/230.01
[58] Field of Search ........................... 365/182, 189.01, 365/230.01

[56] References Cited

U.S. PATENT DOCUMENTS 5,029,130   7/1991   Yeh ................................... 365/185

FOREIGN PATENT DOCUMENTS

WO92/18980   10/1992   WIPO.

Primary Examiner—Terrell W. Fears
Attorney, Agent, or Firm—Sheridan Ross P.C.

[57] ABSTRACT

Disclosed is a semiconductor memory device. The memory device includes a plurality of memory cells, and a write control unit for controlling voltages applied to the memory cells to write data in the memory cells. The memory device further includes a current detector, connected to the write control unit. The current detector being implemented for detecting a cell current flowing in each of the memory cells and controlling the write control unit based on the detected cell current value. In this manner, writing to the memory cells is permitted until desired data is rewritten in each memory cell.

16 Claims, 17 Drawing Sheets

Fig.3 (Prior Art)

| Operation mode | Write | Erase | Read | Standby |
|---|---|---|---|---|
| Word line WLm (Control gate CG) | +2V | +14 to +15V | +4V | 0V |
| Bit line BLm (Drain D) | 0V | 0V | +2V | 0V |
| Common source line SL (Source S) | +12V | 0V | 0V | 0V |
| Substrate 102 | 0V | 0V | 0V | 0V |

Fig.6 (Prior Art)

| Operation mode | Write | Erase | Read | Standby |
|---|---|---|---|---|
| Word line WLm (Control gate CG) | +2V | +14 to +15V | +4V | 0V |
| Bit line BLm (Drain D) | +12V | 0V | +2V | 0V |
| Common source line SL (Source S) | 0V | 0V | 0V | 0V |
| Substrate 102 | 0V | 0V | 0V | 0V |

SEMICONDUCTOR MEMORY DEVICE

BACKGROUND OF THE INVENTION

1. FIELD OF THE INVENTION

The present invention relates generally to a semiconductor memory device. More particularly, the invention relates to non-volatile semiconductor memory devices such as a flash Electrically Erasable and Programmable Read Only Memories (EEPROMs).

2. DESCRIPTION OF THE RELATED ART

Great attention has recently been paid to non-volatile semiconductor memories, such as a Ferro-electric Random Access Memories (FRAMs), Erasable and Programmable Read Only Memories (EPROMs) and EEPROMs. As is well known in the art, EPROMs and EEPROMs use floating gates for storing charges that define stored data, and control gates for detecting a change in the threshold voltage based on the presence or absence of charges. In addition, EEPROMs include flash EEPROMs that are capable of performing data erasures for all memory storage areas or a plurality of data erasures for selected block storage areas. In general, there are two types of memory cells in a flash EEPROM: one is a split gate type and the other is a stack gate type. International Patent Publication WO92/18980 discloses a split gate flash EEPROM.

To reduce power consumption in flash EEPROMs, efforts have been made to ensure operation at a lower supply voltage and a multi-value storage operation. The multi-value storage operation generally stores data having three or more values as well as data having two values indicating a erased state and a written state, (i.e., the storage of 1-bit data in one memory cell).

To ensure that data is written accurately, it is important to precisely control the floating gate voltage of each memory cell in the write mode. In other words, it is important to control the voltage applied to the floating gate to high precision to ensure that the floating gate will have a desired electric potential after a write operation.

Japanese Unexamined Patent Publication No. 4-57294 discloses a write verification technique for multi-value storage modes to ensure high-precision control of the floating gate voltage. The write verification technique first performs writing to memory cells for a given time (e.g., several hundred nanoseconds to several microseconds), and then performs a verify read operation. Then, the data value to be written is compared with the data value that has been read. When the data values do not match, writing is once again executed for a given time. In this manner, the write operation, the verify read operation and the comparison are repeated until both data values coincide. The write verification method is however disadvantageous for fast data writing for at least the following reasons.

(1) It takes time to verify read operations and perform comparison operations that do not directly contribute to writing data in memory cells. More specifically, the transition from the write mode to the verify read mode requires a predetermined time (e.g., several microseconds) to switch from the write bias conditions to the appropriate read bias conditions. In addition, a total of approximately 100 to 300 nsec are needed for the verify read operation and the comparing operation.

(2) To control the electric potential of the floating gate more precisely, the number of repetitions of a cycle (i.e., the write operation, verify read operation and comparing operation) is increased, thus unfortunately increasing the overall time needed for the write operation. Higher precision control is achieved by suppressing the amount of a change in the electric potential of the floating gate in a single write operation. It is thus necessary to repeat the cycle while shortening the time needed for a single write operation.

(3) Since the timing control for switching the individual operations in the cycle from one to another is delicate and complex, designing a semiconductor memory device control circuit bears a considerable burden.

SUMMARY OF THE INVENTION

Broadly speaking, the present invention relates to a semiconductor memory device which can write data in memory cells very fast while precisely controlling data writing in the memory cells. The present invention can be implemented in numerous ways including as an apparatus and a method.

In one embodiment, a semiconductor memory device is disclosed. The memory device includes a plurality of memory cells, and a write control unit for controlling voltages applied to the memory cells to write data in the memory cells. The memory device further includes a current detector, connected to the write control unit. The current detector being implemented for detecting a cell current flowing in each of the memory cells and controlling the write control unit based on the detected cell current value. In this manner, writing to the memory cells is permitted until desired data is rewritten in each memory cell. Further, each of the memory cells has a gate, a source and a drain. The write control unit includes a source voltage controller for controlling a voltage applied to the source of each memory cell, a drain voltage controller for controlling a voltage applied to the drain of each memory cell, and a gate voltage controller for controlling a voltage applied to the gate of each memory cell. The current detector is suited to detect a value of cell current flowing in each of the memory cells and controls the source voltage controller, the drain voltage controller and the gate voltage controller until desired data is written in each memory cell.

In another embodiment, a semiconductor memory device is disclosed. The memory device includes a plurality of memory cells each having a plurality of terminals including a source and a drain. The memory device further includes a write control unit for controlling voltages applied to the plurality of terminals of the memory cells to write data in the memory cells. And a voltage detector that is connected to the write control unit, for detecting a value of voltage at one of the source and the drain of each memory cell. The voltage detector further used for controlling the write control unit based on the detected voltage value such that writing to the memory cells is permitted until desired data is rewritten in each memory cell. Further, each of the memory cells has a gate, a source and a drain. The write control unit includes a source current controller for controlling a current flowing in the source of each memory cell to control a voltage applied to the source of each memory cell, a drain voltage controller for controlling a voltage applied to the drain of each memory cell, and a gate voltage controller for controlling a voltage applied to the gate of each memory cell. The voltage detector is suited to detect a value of voltage at the source of each detects a value of voltage at the source of each memory cell and controls the source current controller, the drain voltage controller and the gate voltage controller such that writing to the memory cells is permitted until desired data is written in each memory cell.

Other aspects and advantages of the invention will become apparent from the following description, taken in conjunction with the accompanying drawings, illustrating by way of example the principals of the invention.

BRIEF DESCRIPTION OF THE DRAWINGS

The invention, together with objects and advantages thereof, may best be understood by reference to the following description of the presently preferred embodiments together with the accompanying drawings in which:

FIG. 3 is a diagram showing the voltages applied to selected word lines, a selected bit lines, the common source line and the substrate in the individual operation modes of the conventional flash EEPROM;

FIG. 6 is a diagram showing voltages applied to a selected word lines, selected bit lines, the common source line and the substrate in the individual operation modes of the second conventional flash EEPROM;

DETAILED DESCRIPTION OF THE PREFERRED EMBODIMENTS

Figure 1:
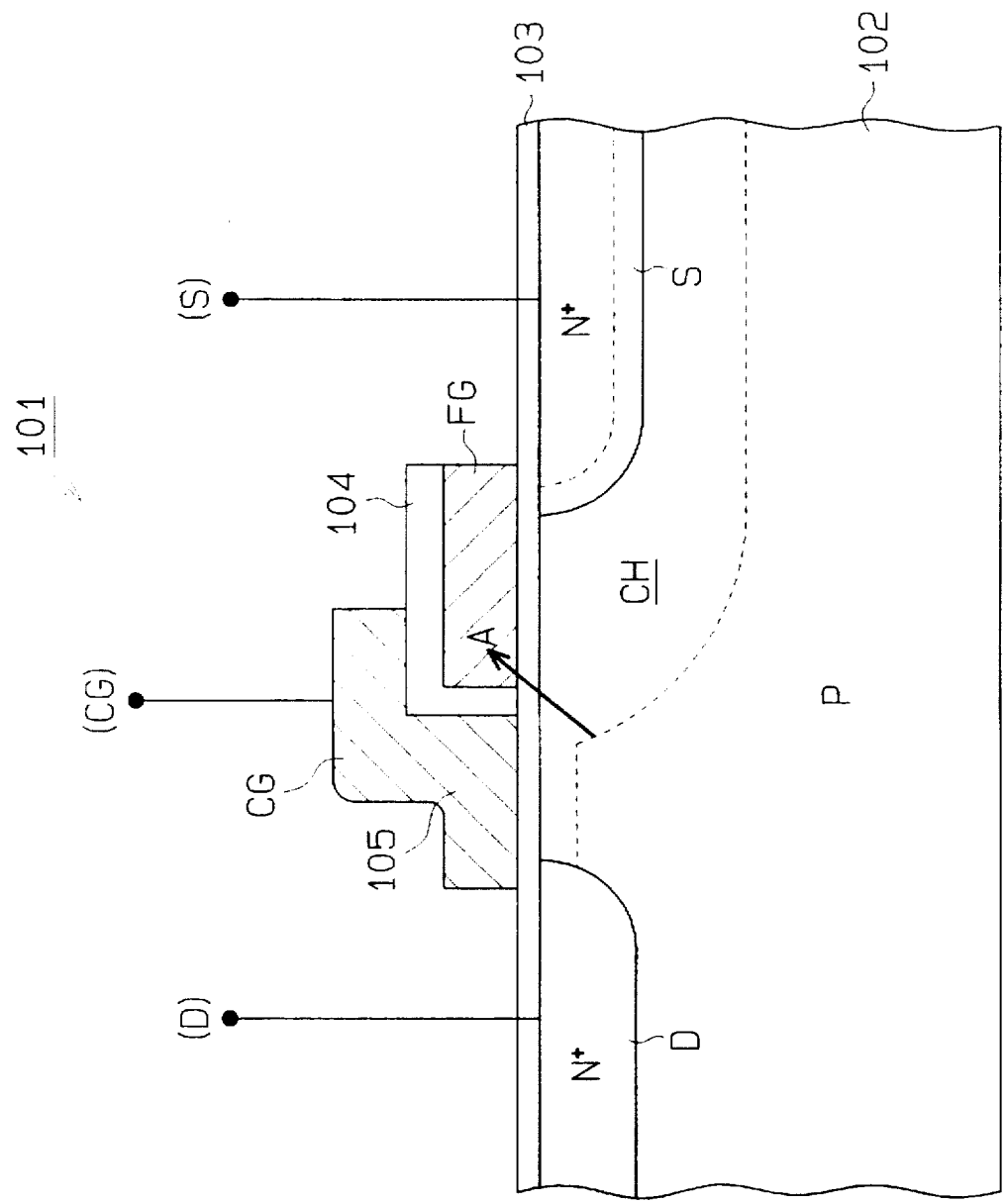
FIG. 1 is a cross-sectional view schematically depicting a conventional split gate memory cell.

A non-volatile semiconductor memory device according to one embodiment of the present invention will now be described with reference to the accompanying drawings. FIG. 1 is a cross-sectional view schematically illustrating a conventional split gate memory cell 101 disclosed in International Patent Publication WO92/18980. The split gate memory cell 101 has a source S of an N type conductivity and a drain D of the N type conductivity, both defined on a single crystalline silicon substrate 102 having a P type conductivity, a floating gate FG provided on a channel CH between the source S and drain D over a first insulator film 103, and a control gate CG provided on the floating gate FG over a second insulator film 104. A part of the control gate CG is arranged as a select gate 105 on the channel CH via the first insulator film 103, and the remaining part of the control gate CG is arranged on the floating gate FG over the second insulator film 104.

Figure 2:
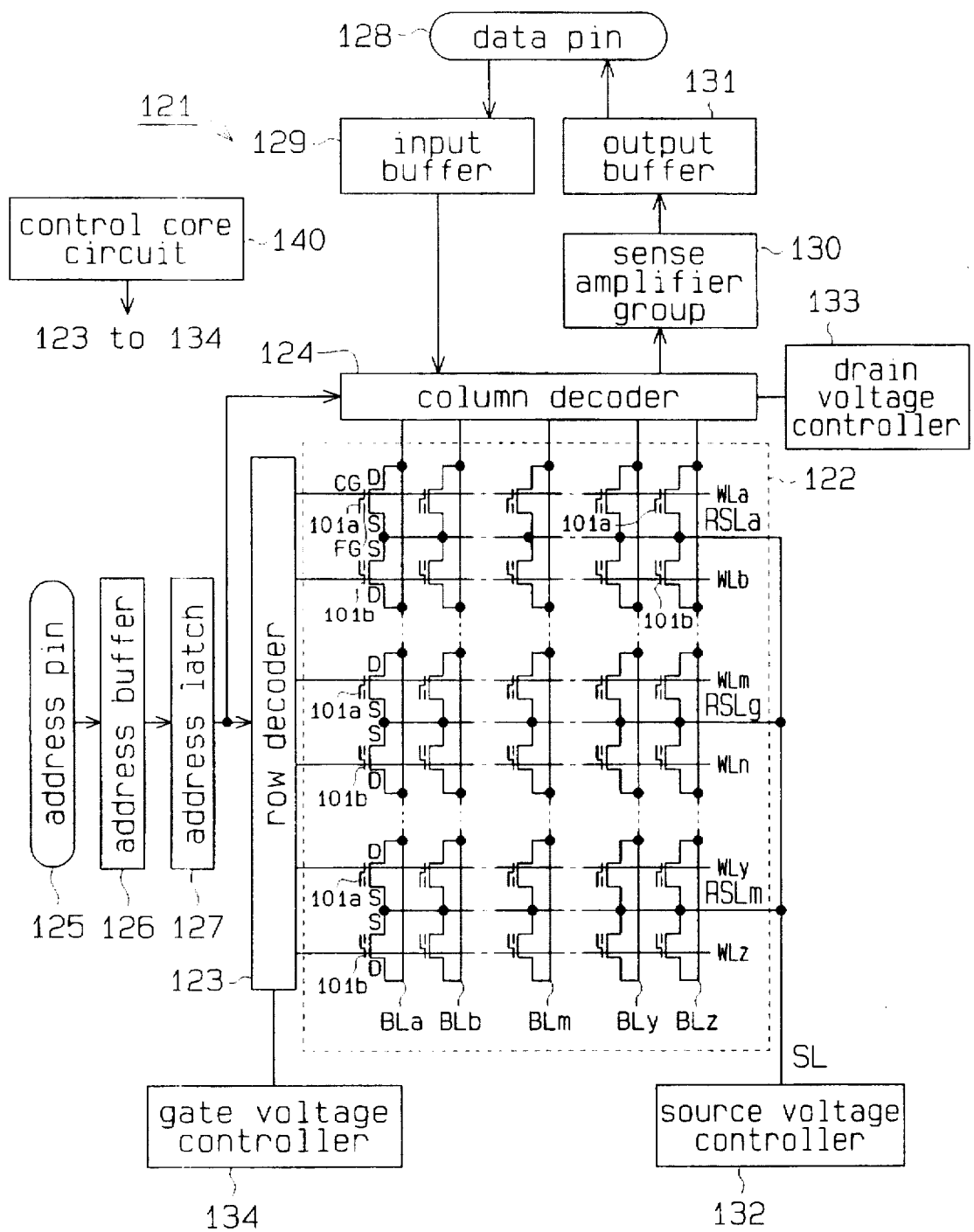
FIG. 2 is a block diagram of a flash EEPROM according to prior art.

FIG. 2 is a block diagram showing a conventional flash EEPROM 121 having a plurality of split gate memory cells 101. The flash EEPROM 121 includes a memory cell array 122, a row decoder 123, a column decoder 124, an address pin 125, an address buffer 126, an address latch 127, a data pin 128, an input buffer 129, a sense amplifier group 130, an output buffer 131, a source voltage controller 132, a drain voltage controller 133, a gate voltage controller 134 and a control core circuit 140.

The memory cell array 122 has a matrix of split gate memory cells 101, a plurality of word lines WLa to WLz each commonly connected to the control gates CG of an associated row of memory cells 101, a plurality of bit lines BLa to BLz each commonly connected to the drains D of an associated column of memory cells 101, and source lines RSLa to RSLm each connected to the common source S of each odd row of memory cells 101a and each even row of memory cells 101b. The individual source lines RSLa–RSLm are connected to a common source line SL. The word lines WLa–WLz are connected to the row decoder 123, and the bit lines BLa–BLz are connected to the column decoder 124. The common source line SL is connected to the source voltage controller 132.

The address pin 125 receives a row address and a column address supplied from an external unit (not shown) and then supplies those addresses to the address buffer 126. The address buffer 126 transfers the row address and column address to the address latch 127. The address latch 127 latches those addresses and transfers the row address to the row decoder 123 and the column address to the column decoder 124. The row decoder 123 selects one word line in accordance with the row address, and connects the selected word line to the gate voltage controller 134. The column decoder 124 selects one bit line in accordance with the column address, and connects the selected bit line to the drain voltage controller 133.

The gate voltage controller 134 controls the voltage applied to the selected word line WLm in accordance with the individual operation modes shown in FIG. 3. The drain voltage controller 133 controls the voltage applied to the selected bit line in accordance with the individual operation modes. The source voltage controller controls the voltage applied to the individual source lines RSLa–RSLm via the common source line SL in accordance with the individual operation modes.

The data pin 128 receives data supplied from the external unit (not shown) and supplies the data to the input buffer 129. The input buffer 129 transfers the data to the column decoder 124. The column decoder 124 controls the voltage applied to any selected one of the bit lines BLa–BLz according to that data.

Data read from an arbitrary memory cell 101 is transferred from the selected bit line to the sense amplifier group 130 via the column decoder 124. The sense amplifier group 130 includes a plurality of sense amplifiers (not shown). The column decoder 124 operates in such a manner as to connect the selected bit line to the sense amplifiers. The sense amplifier group 130 discriminates the data and supplies it to an output buffer 131. The output buffer 131 supplies the data to the data pin 128. The thus read data is supplied from the data pin 128 to an external unit. The control core circuit 140 controls the operations of the row decoder 123, the column decoder 124, the address pin 125, the address buffer 126, the address latch 127, the data pin 128, the input buffer 129, the sense amplifier group 130, the output buffer 131, the source voltage controller 132, the drain voltage controller 133 and the gate voltage controller 134.

The individual operation modes (erase mode, write mode and read mode) of the flash EEPROM 121 will now be discussed with reference to FIG. 3.

(a) Erase Mode

In erase mode, a voltage of the ground level (=0 V) is applied to all the source lines RSLa–RSLm and all the bit lines BLa–BLz. A voltage of +14 to +15 V is applied to a selected word line WLm and a voltage of the ground level is applied to the other, non-selected word lines WLa–WL1 and WLn–WLz. Therefore, data is erased from all the memory cells 101a that are connected to the selected word line WLm as the electric potentials of the control gates CG of those memory cells 101a are pulled up to +14 to +1.5 V.

When the electric potential of the control gate CG is +14 to 15 V and the electric potential of the drain is 0 V, a high electric field is produced between the control gate CG and the floating gate FG so that a Fowler-Nordheim (FN) tunnel current flows between those gates. Consequently, electrons in the floating gate FG are pulled out to the control gate CG, resulting in data erasure. This erasing operation is based on the fact that the electrostatic capacitance between the source S and the substrate 102 and the floating gate FG is significantly greater than that between the control gate CG and the floating gate FG.

Simultaneous selection of a plurality of word lines WLa–WLz allows for data erasure of all the memory cells 101 that are connected to the selected individual word lines. This erasure is called "block erasure".

(b) Write Mode

In write mode, a voltage of the ground level is applied to a selected bit lines BLm and a voltage (in this case +2 V) equal or grater than voltage applied to the other, nonselected bit lines BLa–BL1 and BLn–BLz. A voltage of +2 V is applied to a word line WLm connected to a control gate CG of a selected memory cell 101 and a voltage of the ground level is applied to the other, non-selected word lines WLa–WL1 and WLn–WLz. A voltage of +12 V is applied to the common source line SL. Consequently, the electric potential of the floating gate FG is pulled up by the capacitive coupling between the source S and the floating gate FG, thus producing a high electric field between the control gate CG and the floating gate FG. Thus, the electrons in the channel CH are accelerated to become hot electrons which are supplied to the floating gate FG as shown at an arrow A. As a result, charges are stored in the floating gate FG of the selected memory cell 101 and 1-bit data is written.

It is noted that each memory cell has a threshold voltage Vth of +0.5 V and includes a transistor, which includes a control gate CG, source S and drain D. Therefore, electrons in the drain D are moved in the channel CH in the inverted state, so that the cell current Id flows to the drain D from the source S.

(c) Read Mode

In read mode, a voltage of +4 V is applied to a selected word line WLm and the voltage of the ground level is applied to the other, non-selected word lines WLa–WL1 and WLn–WLz. A voltage of +2 V is applied to a selected bit line BLm and the voltage of the ground level is applied to the other, non-selected bit lines BLa–BL1 and BLn–BLz. As a result, the cell current Id which flows to the source S of the memory cell 101 in the erased state from the drain D becomes greater than the cell current flowing in the memory cell 101 in the written state. This is because the channel CH directly below the floating gate FG of the data-erased A memory cell is enabled, while the channel CH directly below the floating gate FG of the data-written memory cell is disabled in the memory cell 101 in the written state.

More specifically, because electrons are drained from the floating gate FG of a data-erased memory cell, the floating gate FG is positively charged. Therefore, the channel CH directly below the positively-charged floating gate FG is enabled. As electrons are supplied into the floating gate FG of a data-written memory cell, the floating gate FG is negatively charged. The channel CH directly below the negatively-charged floating gate FG is thus disabled. Each sense amplifier in the sense amplifier group 130 discriminates the level of the cell current flowing in the associated memory cell as erase data "1" or write data "0". In this manner, binary data having a data value "1" indicating the erased state and a data value "0" indicating the written state may be stored in each memory cell.

Figure 4:
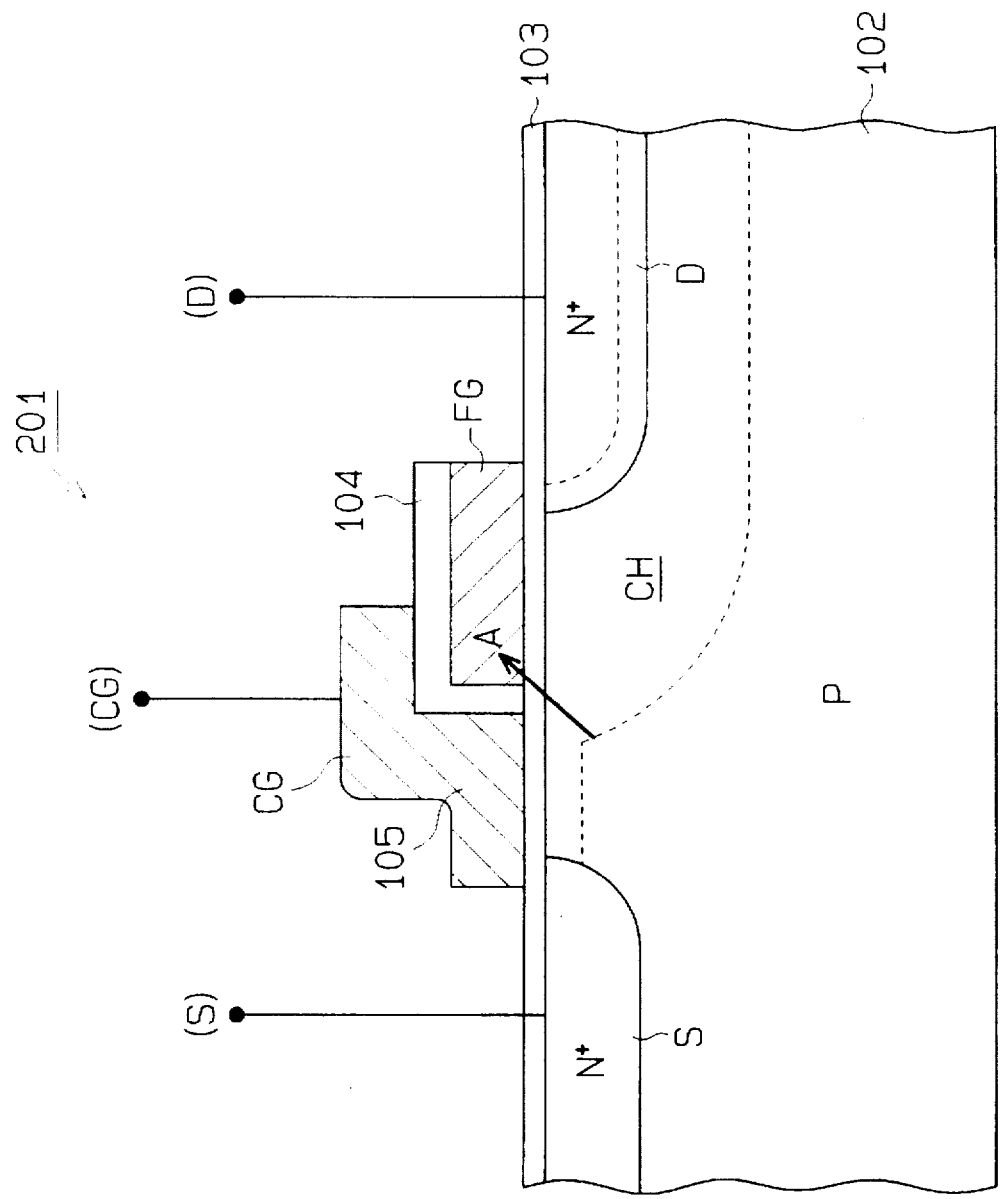
FIG. 4 is a cross-sectional view schematically illustrating another conventional split gate memory cell.
Figure 5:
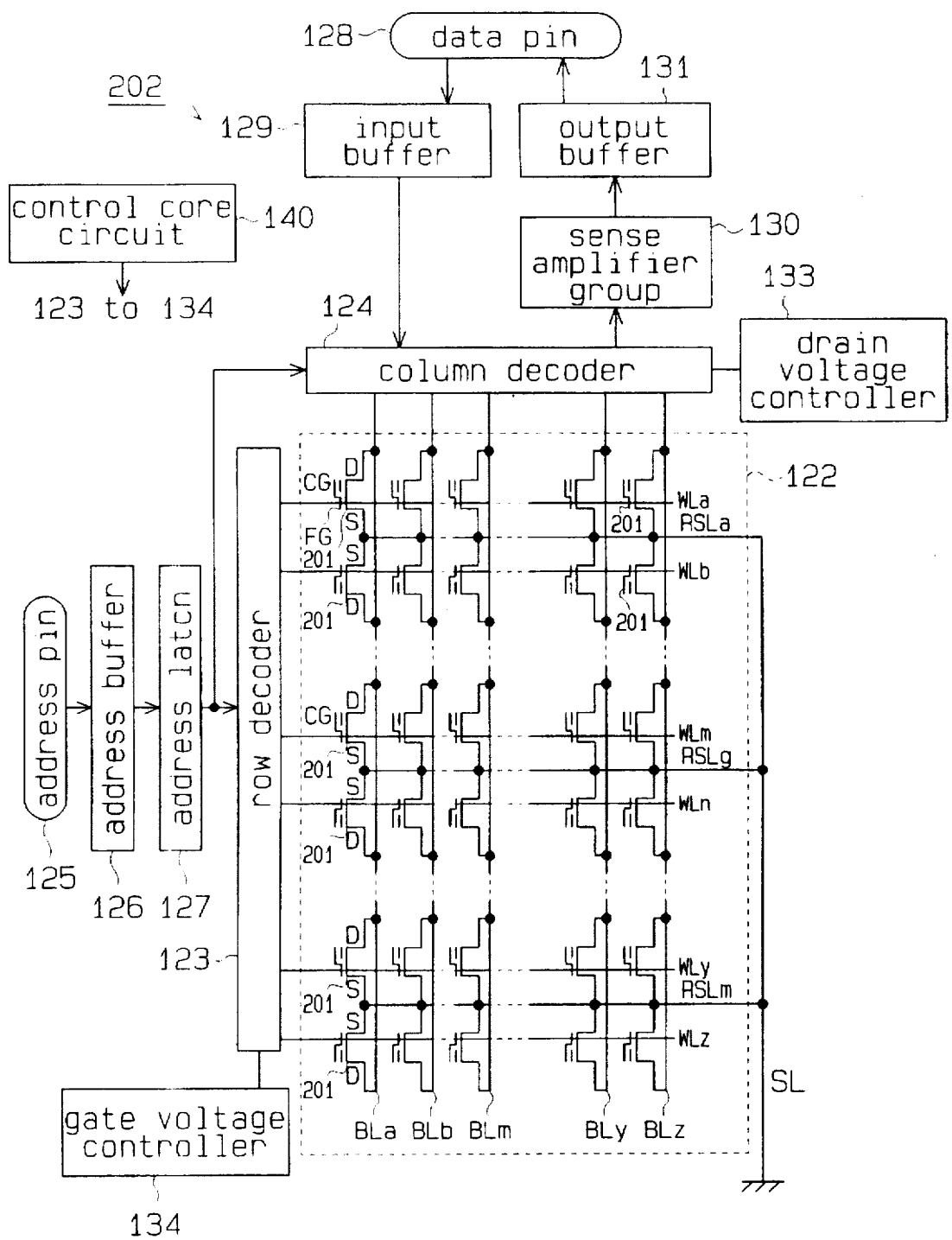
FIG. 5 is a block diagram showing another conventional flash EEPROM.

U.S. Pat. No. 5,029,130 discloses a flash EEPROM in which the source S of the split gate memory cell 101 is identified as a "drain" and the drain D is identified as a "source". FIG. 4 is a cross-sectional view schematically illustrating a split gate memory cell 201, disclosed in U.S. Pat. No. 5,029,130. FIG. 5 is a block diagram showing a flash EEPROM 202 having split gate memory cells 201. FIG. 6 shows voltages applied to a selected word line, a selected bit line, the common source line and the substrate in the individual operation modes of the flash EEPROM 202. The flash EEPROM 202 differs from the flash EEPROM 121 in that the common source line SL is grounded. In any operation mode, the voltage of the ground level is applied to the individual source lines RSLa–RSLm via the common source line SL.

In write mode, +12 V is applied to a selected bit line BLm while the voltage of the ground level is applied to the non-selected bit lines BLa–BL1 and BLn–BLz. As a result, a high electric field is generated between the control gate CG and the floating gate FG. This allows hot electrons to be supplied to the floating gate FG, so that the write current flows to the substrate 102 from the floating gate FG. Consequently, 1-bit data may be written and stored in the selected memory cell 201. In memory cell 201, the cell current flows toward the source S from the drain D.

The source voltage controller 132 in the flash EEPROM 121 may be replaced with a source current controller which controls the cell current value Id to a given value. In this case, the voltages applied to the source lines RSLa–RSLm are controlled in accordance with the individual operation modes as shown in FIG. 3. The drain voltage, controller 133 in the flash EEPROM 121 or the flash EEPROM 202 may be replaced with a drain current controller which controls the cell current value Id to a given value. In this case, the voltage applied to a single bit line is controlled in accordance with each operation mode as shown in FIG. 3 or FIG. 6. The flash EEPROM 121 may be provided with a source line decoder, which selects one source line in accordance with the column address and connects the selected source line to the source voltage controller 132.

Figure 7:
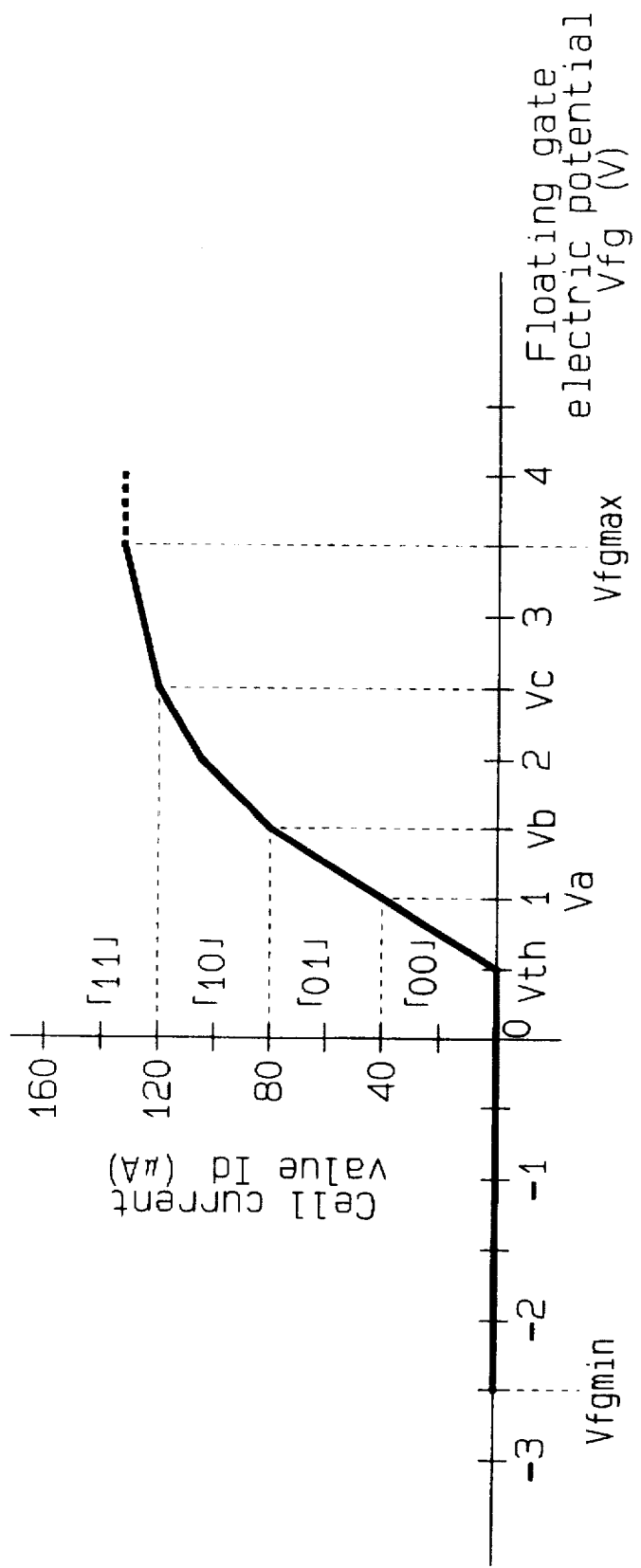
FIG. 7 is a characteristic graph illustrating the relationship between the electric potential of the floating gate of the conventional split gate memory cell and the value of the memory cell current.

In the flash EEPROMs 121 and 202, multi-value data can be stored in any memory cell 101 and 201 by adjusting the value of the cell current Id which flows in that memory cell 101 and 201. FIG. 7 presents a characteristic graph illustrating the relationship between the electric potential, Vfg, of the floating gate of the split gate memory cell 101 and 201 and the cell current value Id. This electric potential Vfg of the floating gate FG (hereinafter referred to as "floating gate potential") is the electric potential of the floating gate FG with respect to the electric potential of the drain D of the memory cell 101 (source S of the memory cell 201), and is given by the following equation:

$$Vfg = Vfgw + Vfgc$$

where Vfgw is the electric potential that is produced by charges stored in the floating gate FG in write mode and Vfgc is the potential produced by the capacitive coupling with the source S of the memory cell 101 (drain D of the memory cell 201). In read mode, the electric potential Vfgc is constant so that the cell current value Id is specifically determined by the electric potential Vfgw. In write mode, the amount of charges in the floating gate FG or the electric potential Vfgw can be controlled by adjusting the write operation time. The control on the floating gate potential Vfg permits the cell current value Id in read mode to be set in an arbitrary value.

Suppose that a data value "00", is associated with the area of the cell current value Id which is less than 40 μA, a data value "01" is associated with the area of the cell current value Id which is equal to or greater than 40 μA and less than 80 μA, a data value "10" is associated with the area of the cell current value Id which is equal to or greater than 80 μA and less than 120 μA, and a data value "11" is associated with the area of the cell current value Id which is equal to or greater than 120 μA. In this case, the write operation time is controlled in such a way that individual floating gate potentials Va, Vb and Vc corresponding to the individual cell current values Id (40 μA, 80 μA and 120 μA) in write mode.

When the floating gate potential Vfg is equal to or greater than Vc (Vc=about+2.5 V), the data value "11" is stored in a data-erase memory cell from whose floating gate FG electrons are drawn out. In writing data in that data-erased memory cell, as charges are being stored in the floating gate FG, the floating gate potential Vfg drops.

When the writing operation is stopped at the time the floating gate potential Vfg becomes equal to or greater than Vb (=+1.5 V) and less than Vc (=+2.5 V), the data value "10" is written in the memory cell. When the writing operation is stopped at the time the floating gate potential Vfg becomes equal to or greater than Va (=+1.0 V) and less than Vb, the data value "01" is written in the memory cell. When the writing operation is stopped at the time the floating gate potential Vfg becomes less than Va, the data value "00" is written in the memory cell. In this manner, four-value (2-bit) data can be stored in a single memory cell.

In read mode, when the floating gate potential Vfg is smaller than the threshold voltage Vth (=+0.5 V) of the transistor which has the floating gate FG, the source S and the drain D, the cell current value Id is 0. When the floating gate potential Vfg exceeds the threshold voltage Vth, the cell current value Id increases upper rightward in FIG. 11. When the floating gate potential Vfg exceeds +3.5 V, the cell current value Id is saturated due to the constant resistance of the channel CH which lies directly below the control gate CG. That is, the channel CH serves as a constant resistor because a constant voltage (=+4 V) is applied to the control gate CG. Therefore, a series connection of the transistor to the constant resistor of the channel CH is present in the memory cell. When the floating gate potential Vfg is less than a given value (=+3.5 V), as apparent from the above, the cell current value Id varies in accordance with the characteristic of the transistor.

A flash EEPROM having split gate memory cells according to a first embodiment of the invention will now be described with reference to the accompanying drawings. To avoid the redundant description, like or same reference numerals are given to those components which are the same as the corresponding components of the prior art.

Figure 8:
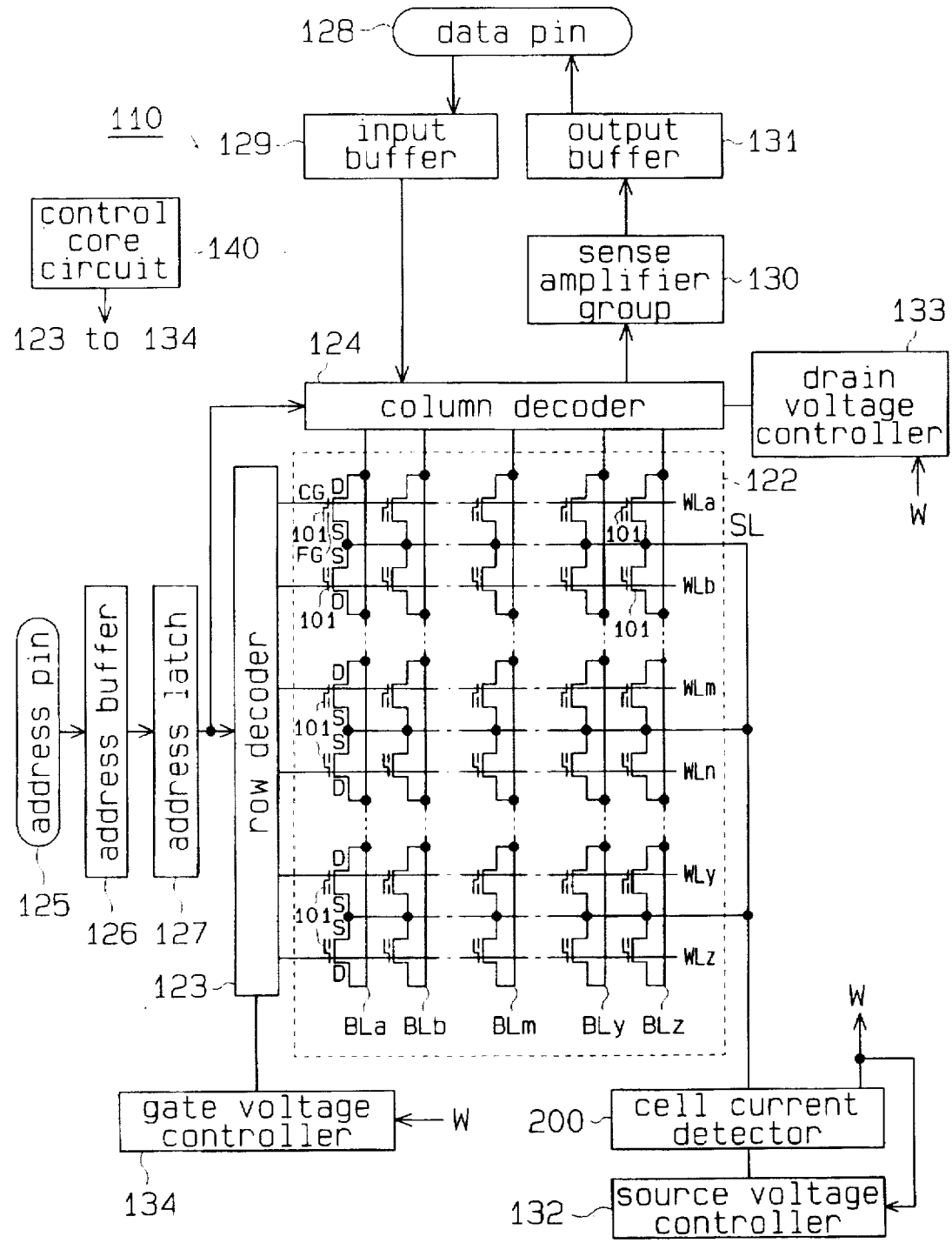
FIG. 8 is a block diagram of a flash EEPROM according to a first embodiment of the invention.

As shown in FIG. 8, a flash EEPROM 110 according to the first embodiment includes a cell current detector 200 in addition to (the memory cell array 122, the row decoder 123, the column decoder 124, the address pin 125, the address buffer 126, the address latch 127, the data pin 128, the input buffer 129, the sense amplifier group 130, the output buffer 131, the source voltage controller 132, the drain voltage controller 133, the gate voltage controller 134 and the control core circuit 140).

The cell current detector 200, connected between the source voltage controller 132 and the common source line SL, detects the value of the cell current in each memory cell 101 and generates a detection signal W having a predetermined level in accordance with the detected cell current value. The source, drain and gate voltage controllers 132–134 operate in accordance with the detection signal W from the cell current detector 200. The individual voltage controllers 132–134 control the voltages applied to the common source line SL, the selected bit line and the selected word line in the same way as done in the prior art in accordance with the detection signal W having a low (L) level. The individual voltage controllers 132–134 set the voltages applied to the respective lines to the ground level based on the detection signal W having a high (H) level.

Figure 9:
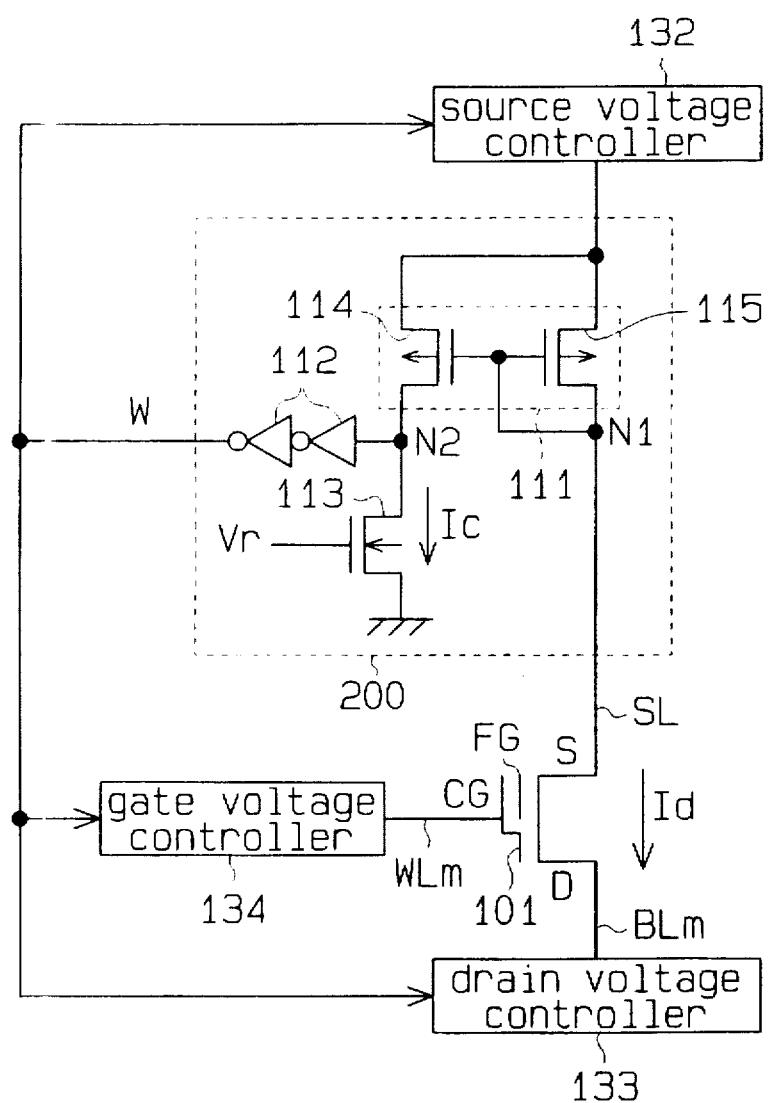
FIG. 9 is a block diagram depicting a cell current detector in the flash EEPROM in FIG. 8.

As shown in FIG. 9, the cell current detector 200 includes a current mirror circuit 111, which includes two PMOS transistors 114 and 115, two inverters 112 and an NMOS transistor 113.

The current mirror circuit 111 has an input-side node N1 connected to the common source line SL and an output-side node N2 grounded via the NMOS transistor 113. The node N1 is also connected to the gates of both PMOS transistors 114 and 115 of the current mirror circuit 111. The node N2 is connected to the source, drain and gate voltage controllers 132–134 via the two series-connected inverters 112.

The NMOS transistor 113 has a gate applied with a constant voltage Vr, so that the NMOS transistor 113 serves as a resistor having a constant ON resistance. The value of the current Ic which flows to the ground via the NMOS transistor 113 from the PMOS transistor 114 of the current mirror circuit 111 is substantially equal to the current value Id when the transistors 114 and 115 are equal in size. This is because the current value Ic is acquired by multiplying the size ratio of the transistors 114 and 115 by the cell current value Id. That is, Ic=the size of the transistor 114 divided by (÷) the size of the transistor 115 multiplied by (×) Id. The detection signal W from the cell current detector 200 is then supplied to the individual voltage controllers 132–134 through the inverters 112.

Figure 10:
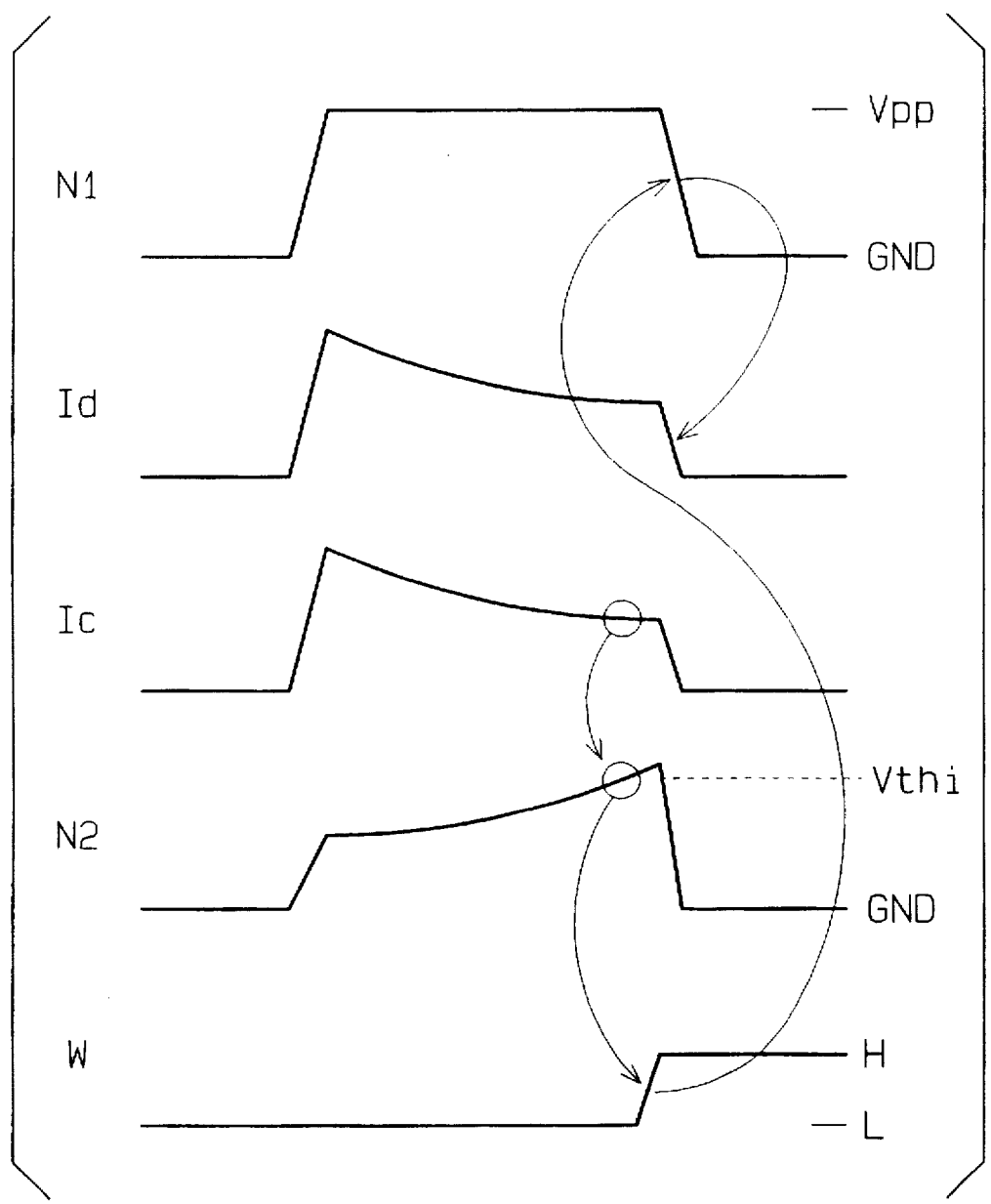
FIG. 10 is a signal waveform chart illustrating the operation of the cell current detector in FIG. 9.

FIG. 10 illustrates voltage waveforms for nodes N1 and N2, the cell current value Id, the current value Ic and the detection signal W in the write mode. "Vpp" identifies the voltage of the internal voltage supply of the flash EEPROM 110.

When the voltage at the node N2 is at the ground level before the write operation starts, the L-level detection signal W is output from the series circuit of inverters 112. In accordance with the L-level detection signal W, the individual voltage controllers 132–134 control the voltages that are applied to the common source line SL, the bit line BLm and the word line WLm in the same manner as done in the prior arts, so that the write operation is initiated. At this time, the voltage at the node N1 is controlled to a constant value by the source and drain voltage controllers 132 and 133.

As charges are stored in the floating gate FG after the writing has started, the electric potential of the floating gate (hereinafter referred to as "floating gate potential") and the cell current value Id decrease. Consequently, the current value Ic decreases in proportional to the cell current value Id while the voltage at the node N2 rises. When the voltage at the node N2 rises to or above an input threshold voltage Vthi, the H-level detection signal W is output. In accordance with the H-level detection signal W, the individual voltage controllers 132–134 set the voltages applied to the common source line SL, the bit line BLm and the word line WLm to the ground level. As a result, the write operation is stopped.

According to the first embodiment, as apparent from the above, the floating gate potential Vfg can be controlled by detecting the cell current value ID which is associated with the floating gate potential Vfg. In other words, it is possible to precisely control the floating gate potential or the amount of charges to be stored in the floating gate by stopping the write operation when the cell current value Id reaches a predetermined value. That is, the written states of the memory cells may be accurately controlled. It is therefore possible to carry out fast writing while precisely controlling the floating gate potentials of the memory cells without using the write verification method. In addition, this can facilitate the accomplishment of an operation on a lower supply voltage and a multi-value storage operation.

The predetermined cell current value Id is a reference value for determining if the floating gate potential has reached the predetermined value, and is easily changeable by adjusting the constant voltage Vr or the ON resistance of the NMOS transistor 113. In the multi-value storage operation, the detection of the cell current value Id while varying the constant voltage Vr permits multi-value data to be accurately written in the memory cells 101.

As shown in FIG. 7, the cell current value Id of a data-erased memory cell is equal to or greater than 120 µA. To write a data value "10" in this memory cell, the write operation is stopped when the cell current value Id becomes equal to or greater than 80 µA and less than 120 µA. To write a data value "01" in the memory cell, the write operation is stopped when the cell current value Id becomes equal to or greater than 40 µA and less than 80 µA. To write a data value "00" in the memory cell, the write operation is stopped when the cell current value Id becomes less than 40 µA. The alteration of the constant voltage Vr in accordance with the individual cell current values Id (40 µA, 80 µA and 120 µA) allows the floating gate potential to be accurately controlled to the electric potentials Va to Vc associated with the individual data values. In other words, 4-value data can be accurately and easily written in the memory cells by changing the constant voltage Vr associated with the predetermined cell current value Id.

According to the first embodiment, the detection signal W may be supplied only to the gate voltage controller 134 to stop the write operation. When the level of the detection signal W changes to the H level from the L level, the voltages applied to the common source line SL and the bit line BLm are kept at the levels for the write operation while the voltage of the ground level is applied only to the word line WLm.

To inhibit the write operation, the detection signal W may be supplied only to the source voltage controller 132. In general, the source voltage controller 132 controls the voltage applied to the common source line SL in a similar manner as done in the prior arts in accordance with the L-level detection signal W. In accordance with the H-level detection signal W, the source voltage controller 132 sets the voltage applied to the common source line SL to or lower than +5 V.

A flash EEPROM according to a second embodiment of the invention will now be described with reference to the accompanying drawings. To avoid the redundant description, like or same reference numerals are given to those components which are the same as the corresponding components of the first embodiment.

Figure 11:
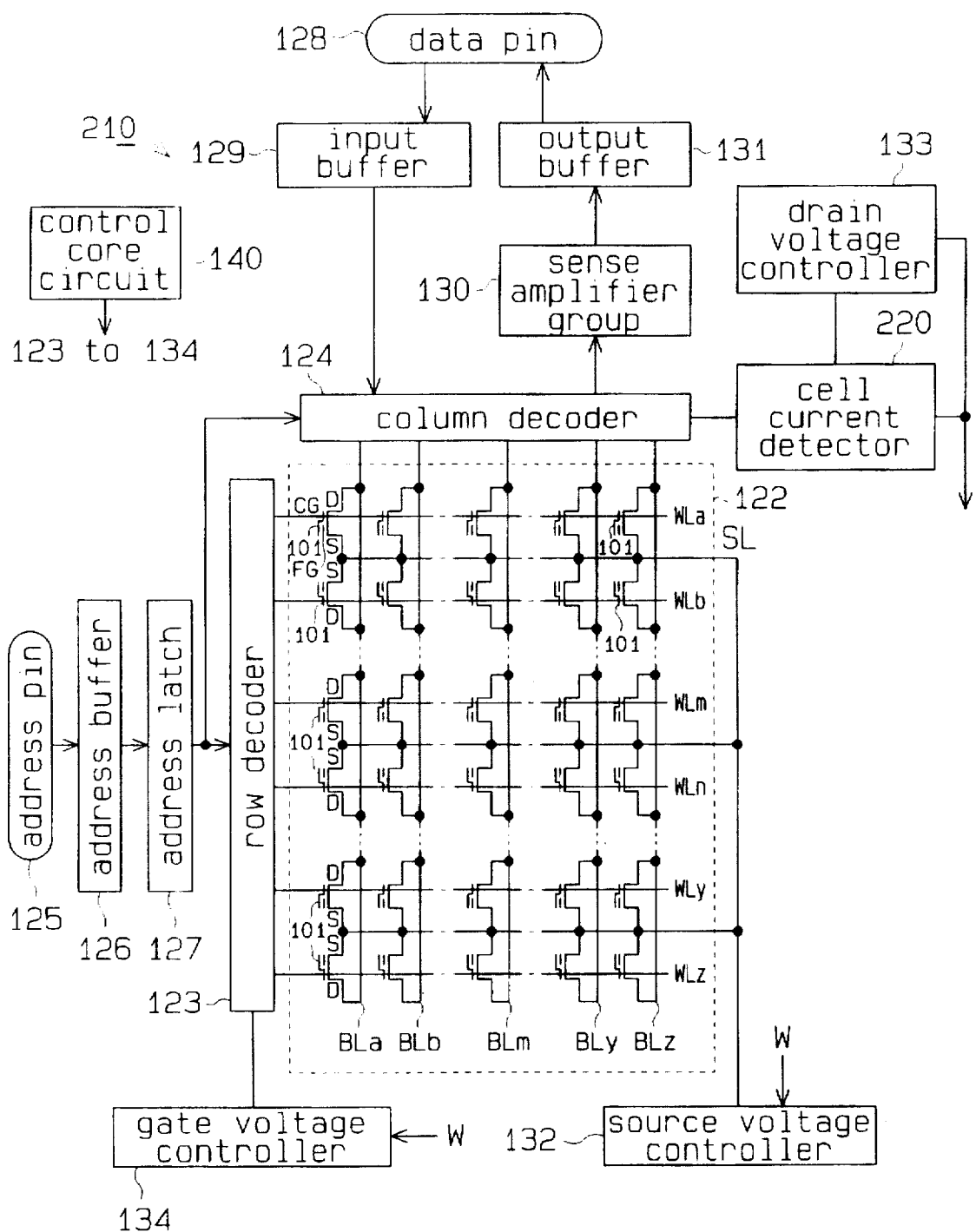
FIG. 11 is a block diagram of a flash EEPROM according to a second embodiment of the invention.

FIG. 11 presents a block diagram showing a flash EEPROM 210 according to the second embodiment. The flash EEPROM 210 differs from the flash EEPROM 110 of the first embodiment in that a cell current detector 220 is connected between the drain voltage controller 133 and the column decoder 124. The cell current detector 220 detects the cell current value Id of each memory cell 101 and generates the detection signal W according to the detected cell current value Id. The source, drain and gate voltage controllers 132–134 operate in accordance with the detection signal W from the cell current detector 220.

Figure 12:
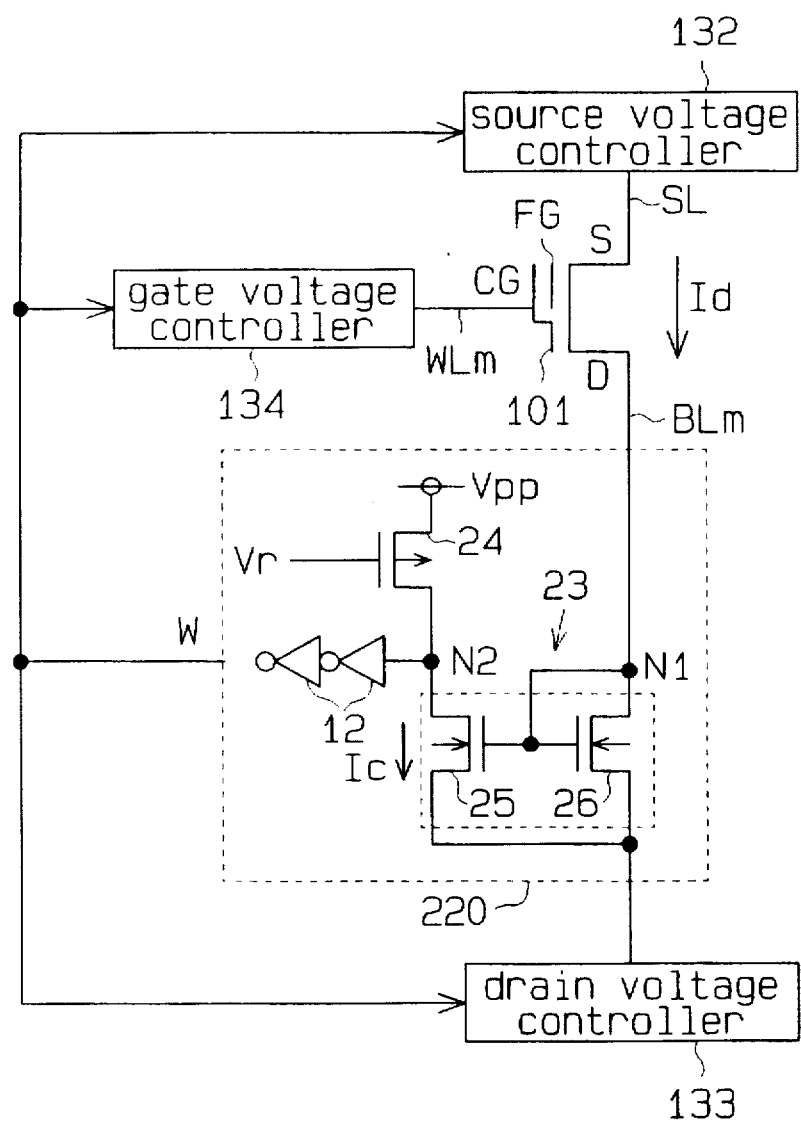
FIG. 12 is a block diagram depicting a cell current detector in the flash EEPROM in FIG. 11.

As shown in FIG. 12, the cell current detector 220 includes a current mirror circuit 23, which is comprised of two NMOS transistors 25 and 26, two inverters 12 and a PMOS transistor 24.

The current mirror circuit 23 has an input-side node N1 connected to the bit line BLm via the column decoder 124 (not shown), and an output-side node N2 connected to an internal voltage supply Vpp of the flash EEPROM 210 via the PMOS transistor 24. The node N1 is also connected to the gates of both NMOS transistors 25 and 26 of the current mirror circuit 23. The node N2 is connected to the source, drain and gate voltage controllers 132–134 via the two series-connected inverters 12. The PMOS transistor 24 has a gate which is applied with the constant voltage Vr, so that the PMOS transistor 24 serves as a resistor having a constant ON resistance.

According to the second embodiment, the current value Ic which is proportional to the cell current value Id is given by the current that flows from the internal voltage supply Vpp to the NMOS transistor 25 of the current mirror circuit 23 via the PMOS transistor 24. This current value Ic is acquired by multiplying the size ratio of the transistors 25 and 26 by the cell current value Id. That is, Ic is equal to (=) the size of the transistor 25 divided by (÷) the size of the transistor 26 multiplied by (×) Id. The detection signal W from the cell current detector 220 is supplied to the individual voltage controllers 132–134 through the inverters 12.

The cell current detector 220 in the second embodiment detects the cell current value Id on the drain (D) side of each memory cell 101, whereas the cell current detector 200 in the first embodiment detects the cell current value Id on the source (S) side of the memory cell 101. The second embodiment therefore has the same advantages as the first embodiment.

A flash EEPROM according to a third embodiment of this invention will now be described with reference to the accompanying drawings. To avoid the redundant description, like or same reference numerals are given to those components which are the same as the corresponding components of the first embodiment.

Figure 13:
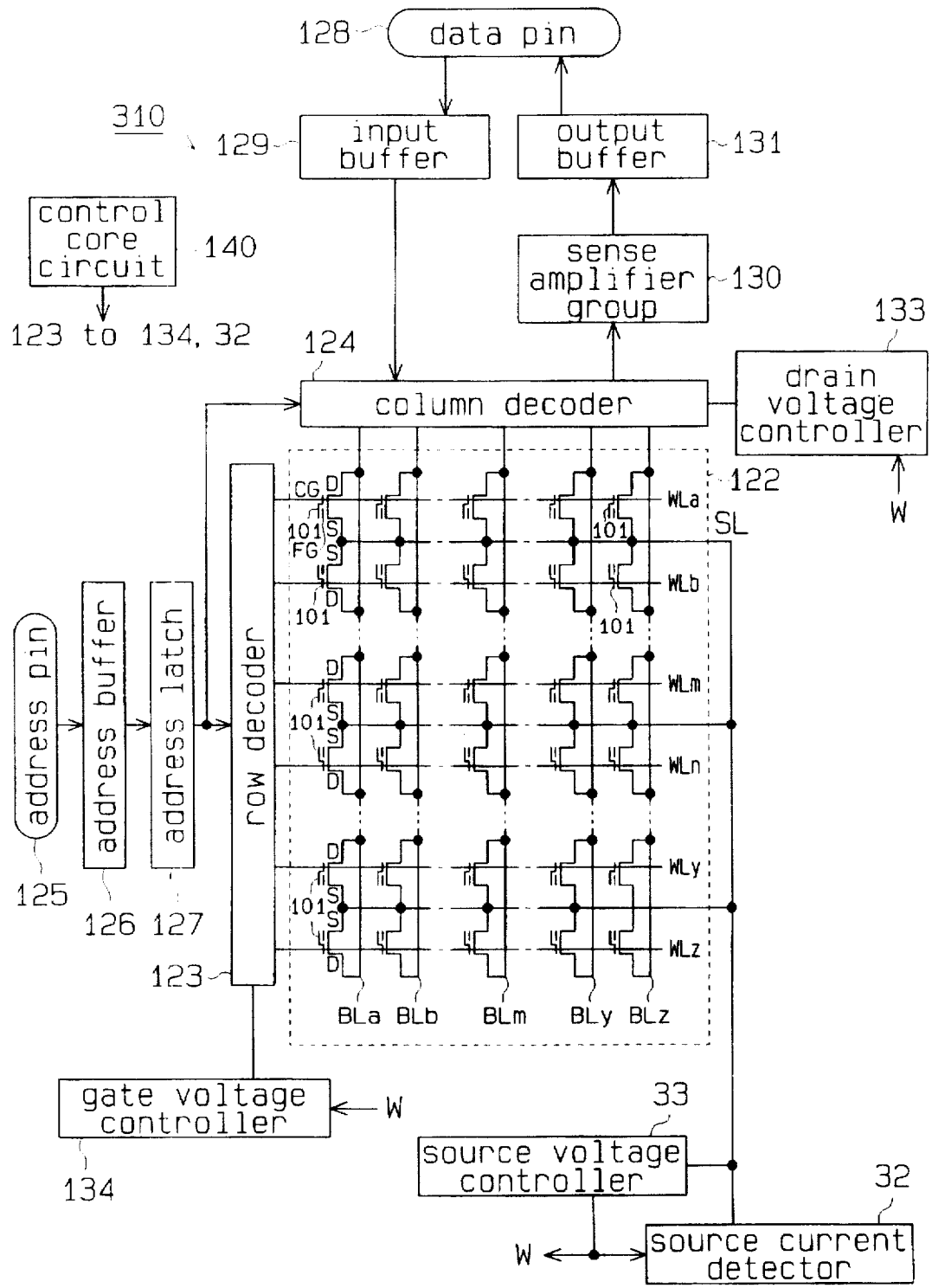
FIG. 13 is a block diagram of a flash EEPROM according to a third embodiment of the invention.

FIG. 13 is a block diagram showing a flash EEPROM 310 according to the third embodiment. The flash EEPROM 310 differs from the flash EEPROM 110 of the first embodiment in the following points.

(1) The source voltage controller 132 is replaced with a source current controller 320. This source current controller 320 controls the cell current value Id to a constant value so that the voltage applied to the common source line SL is controlled in accordance with the individual operation modes shown in FIG. 3. In addition, the control core circuit 140 controls the operation of the source current controller 320.

(2) A source voltage detector 33 is connected between the source current controller 320 and the common source line SL. The source voltage detector 33 detects the voltage applied to the source S of each memory cell 101 or the common source line SL, and generates a detection signal W according to the detected voltage. In the write operation, the source current, drain and gate voltage controllers 320, 133 and 134 operate in accordance with the detection signal W having a predetermined level from the source voltage detector 33. The controllers 320, 133 and 134 control the voltages applied to the common source line SL, the bit line BLm and the word line WLm in the same manner as done in the prior art based on the L-level detection signal W. In accordance with the H-level detection signal W, the controllers 320, 133 and 134 set the voltages applied to those lines to the ground level.

Figure 14:
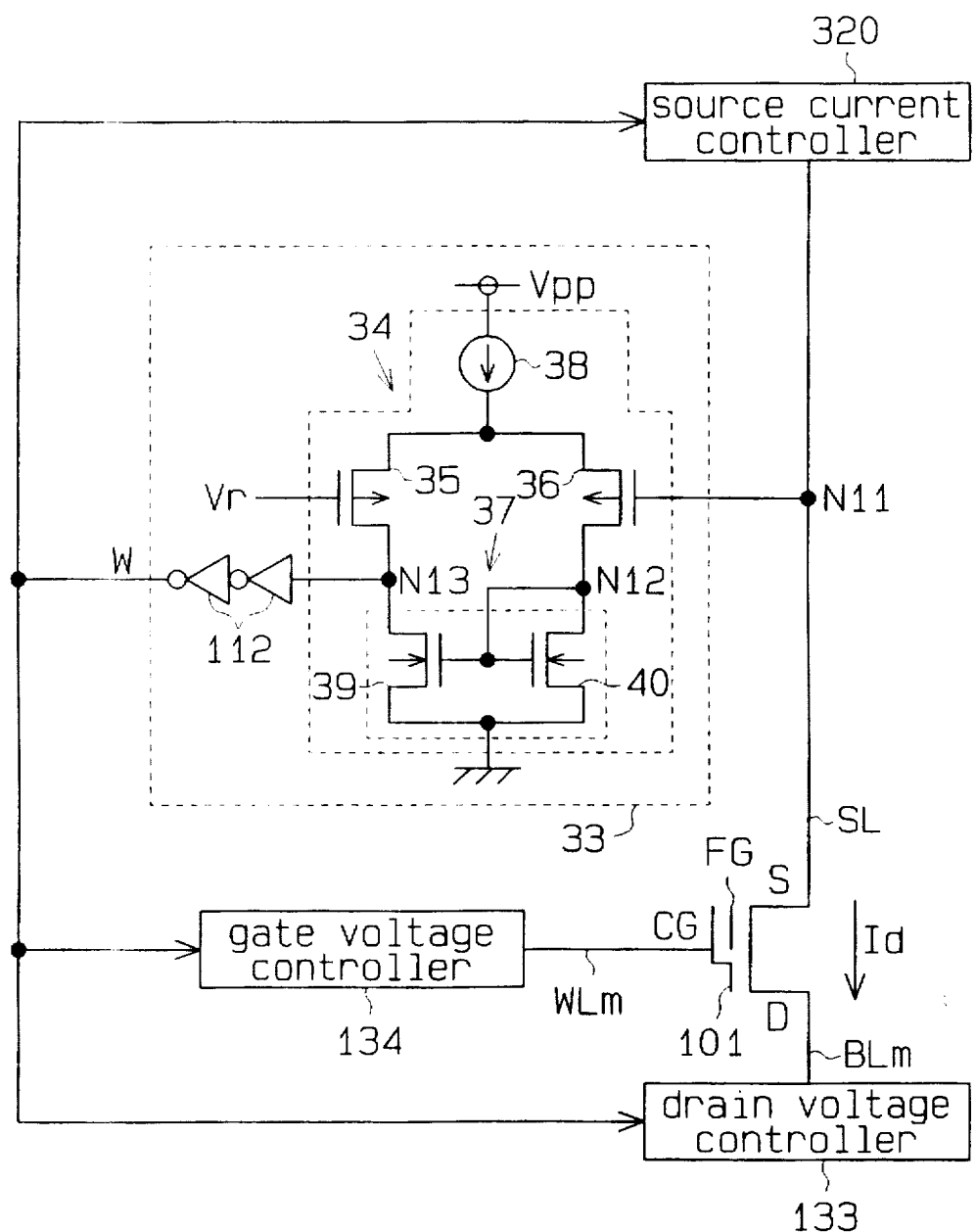
FIG. 14 is a block diagram depicting a source voltage detector in the flash EEPROM in FIG. 13.

As shown in FIG. 14, the source voltage detector 33 includes a differential amplifier 34 and inverters 112. The differential amplifier 34 includes PMOS transistors 35 and 36, a current mirror type load 37 and a constant current source 38.

The current mirror type load 37 is comprised of NMOS transistors 39 and 40. The differential amplifier 34 has a first input terminal (the gate of the PMOS transistor 36) connected to the common source line SL at a node N11, a second input terminal (the gate of the PMOS transistor 35) to which the constant voltage Vr is applied, and an output terminal connected to the two series-connected inverters 112 at a node N13. The differential amplifier 34 amplifies the voltage applied to the first input terminal (node N11) and outputs the amplified voltage from the output terminal (node N13).

The PMOS transistor 35 has a gate which is applied with the constant voltage Vr, a drain connected to the inverters 112 and the drain of the NMOS transistor 39, and a source connected via the constant current source 38 to the internal voltage supply Vpp. The PMOS transistor 36 has a gate connected to the common source line SL at the node N11, a drain connected to the drain of the NMOS transistor 40, and a source connected via the constant current source 38 to the internal voltage supply Vpp. The gates of the NMOS transistors 39 and 40 are connected together while their sources are connected to the ground. The drain of the NMOS transistor 40 is connected to the gates of the NMOS transistors 39 and 40.

In the third embodiment, the transistor 35 is designed larger in size than the transistor 36. Further, the size of the transistor 39 is designed larger than that of the transistor 40. Therefore, the amplification factor of the differential amplifier 34 is determined by the size ratio of the transistors 35 and 36 and the size ratio of the transistors 39 and 40. The transistors 35 and 36 may be designed to be the same size, and the transistors 39 and 40 may likewise be designed to be the same size. In this case, the amplification factor of the differential amplifier 34 would become "1". The detection signal W from the source voltage detector 33 is supplied to the individual controllers 320, 133 and 134 through the inverters 112.

Figure 15:
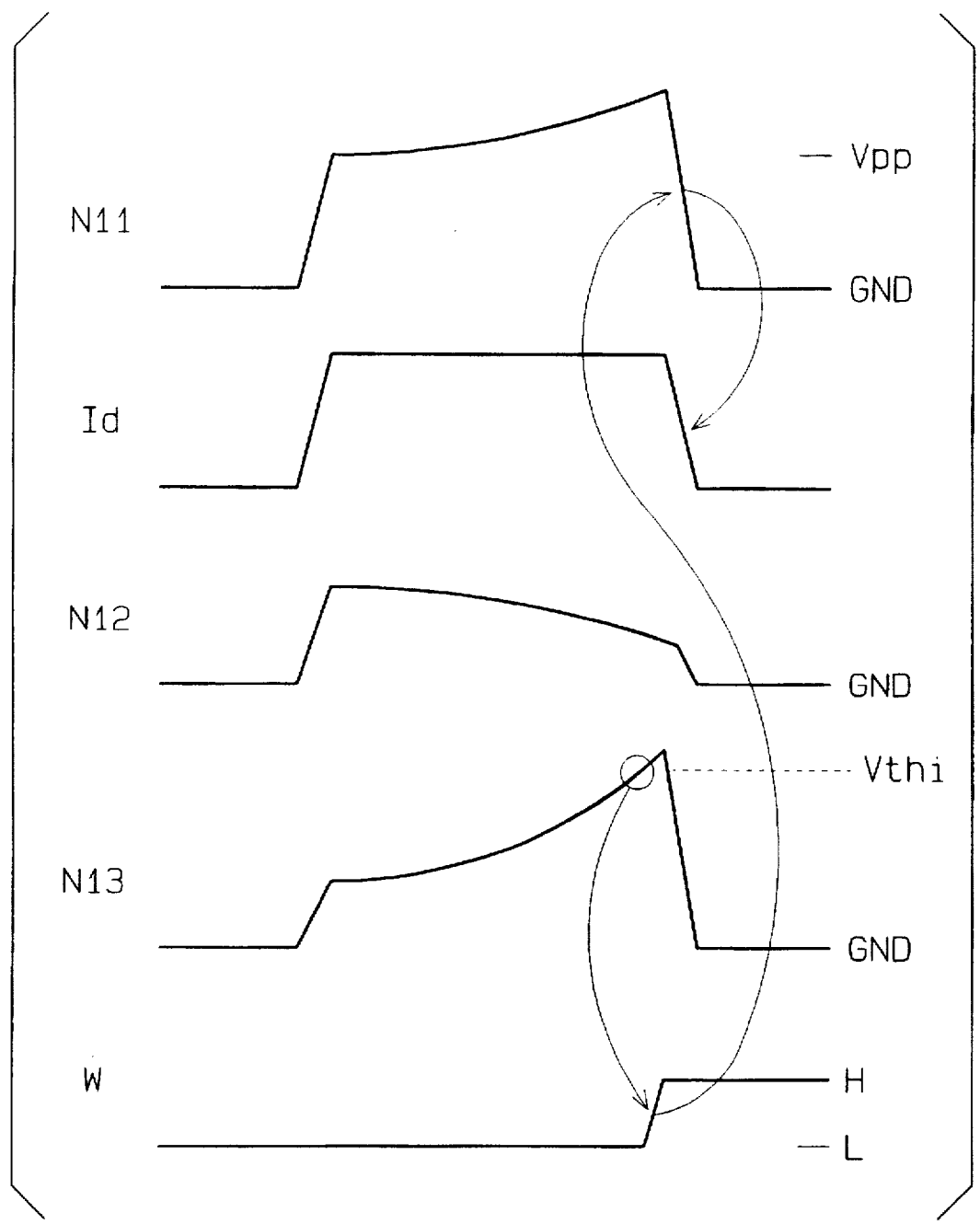
FIG. 15 is a signal waveform chart illustrating the operation of the source voltage detector in FIG. 14.

FIG. 15 shows voltage waveforms of the individual nodes N11–N13, the cell current value Id and the detection signal W in the write mode.

As the voltage at the node N13 has the ground level before the initiation of the write operation, the L-level detection signal W is output through the series circuit of inverters 112. In accordance with the L-level detection signal W, the individual controllers 320, 133 and 134 control the voltages applied to the common source line SL, the bit line BLm and the word line WLm in the same manner as done in the prior arts, so that the write operation is initiated. At this time, the cell current value Id is controlled to a constant value by the source current controller 32.

As charges are stored in the floating gate FG after writing has started, the floating gate potential and the cell current value Id fall. Then, the voltage on the common source line SL (node N11) rises by the operation of the source current controller 32 which controls the cell current value Id to the constant value. As the voltage at the node N11 rises, the voltage at the node N13 also rises. When the voltage at node N13 rises to or above the input threshold voltage Vthi of the inverters 112, the H-level detection signal W is output. In accordance with the H-level detection signal W, the individual controllers 320, 133 and 134 set the voltages applied to the common source line SL, the bit line BLm and the word line WLm to the ground level. As a result, the write operation is stopped.

According to the third embodiment, as apparent from the above, when the voltage at the node N11 (i.e., the source S of the memory cell) reaches a predetermined value, the level of the detection signal W is shifted to the H level from the L level, thus disabling the write operation. Since the voltage at the node N11 rises in such a way as to cancel out a decrease in the cell current value Id caused by the write operation, the node N1 is associated with the cell current value Id. Further, the cell current value Id is also associated with the floating gate potential. The floating gate potential can therefore be controlled by detecting the voltage at the node N11 or the source voltage value. Like the first embodiment which detects the cell current value Id, therefore, the third embodiment can precisely control the floating gate potential. That is, the written states of the memory cells may be accurately controlled.

The predetermined voltage value at the node N11 can easily be changed by adjusting the constant voltage Vr. In the multi-value storage operation, detection of the voltage at node N11, while varying the constant voltage Vr, permits multi-value data to be accurately written in the memory cells 101. More specifically, changing the constant voltage Vr so as to alter the voltage at the node N11 based on the current values Id (40 μA, 80 μA and 120 μA) of an individual cell allows the floating gate potential to be accurately controlled to the electric potentials Va to Vc associated with the individual data values. In other words, 4-value data can be accurately and easily written in the memory cells by changing the constant voltage Vr associated with the predetermined source voltage.

According to the third embodiment, the detection signal W may be supplied only to the gate voltage controller 134 to stop the write operation. Further, the detection signal w may be supplied only to the source current controller 32. In this case, the source current controller 32 sets the voltage applied to the common source line SL about +5 V or lower in accordance with the H-level detection signal W.

A flash EEPROM according to a fourth embodiment of this invention will now be described with reference to the accompanying drawings. To avoid the redundant description, like or same reference numerals are given to those components which are the same as the corresponding components of the first and third embodiments.

Figure 16:
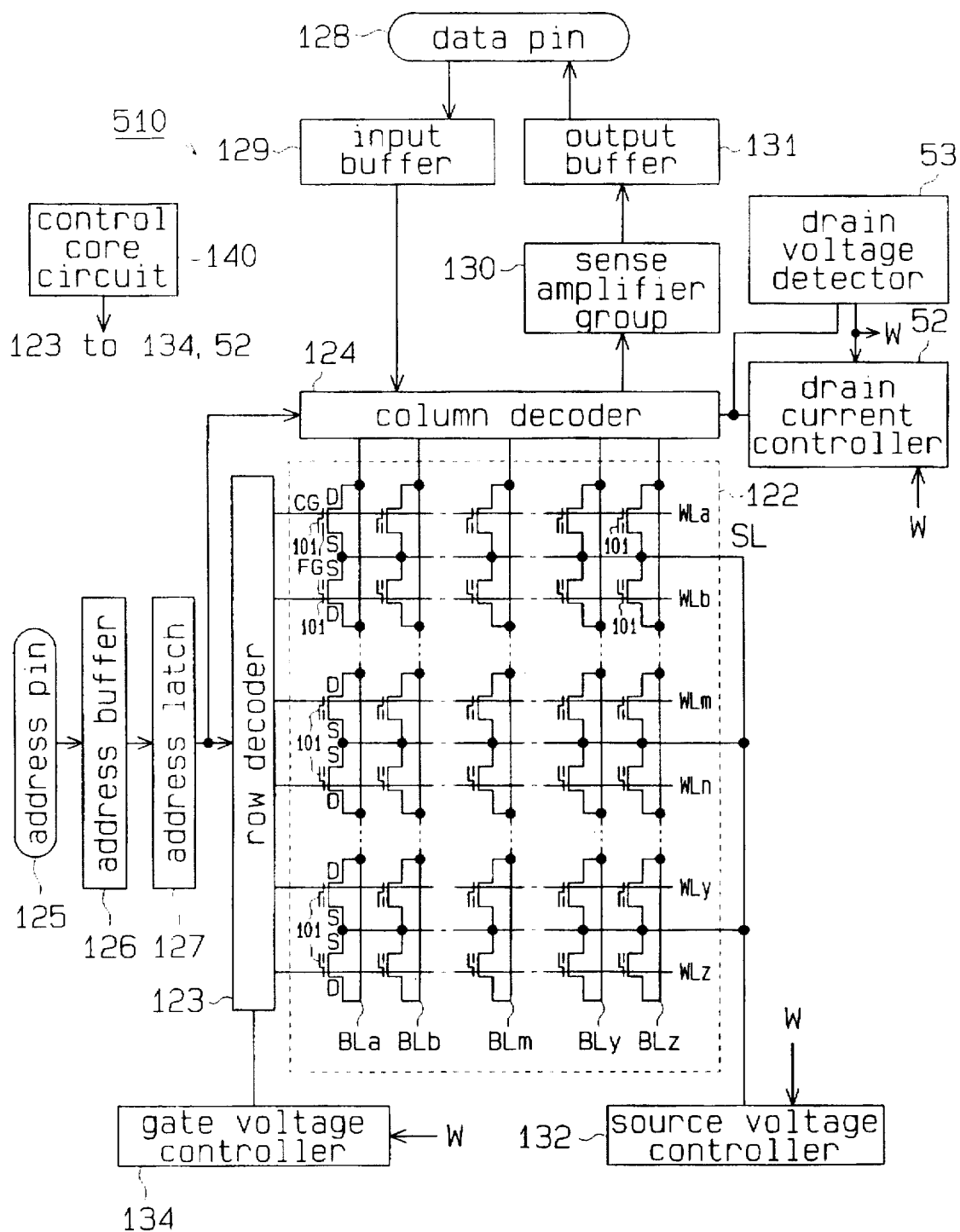
FIG. 16 is a block diagram of a flash EEPROM according to a fourth embodiment of the invention.

FIG. 16 presents a block diagram showing a flash EEPROM 510 according to the fourth embodiment. The flash EEPROM 510 differs from the flash EEPROMs 110 of the first embodiment and the flash EEPROM 310 of the third embodiment in the following points.

(1) The drain voltage controller 133 is replaced with a drain current controller 52. This drain current controller 52 controls the cell current value Id to a constant value so that the voltage applied to the selected bit line is controlled in accordance with the individual operation modes shown in FIG. 3. The control core circuit 140 controls the operation of the drain current controller 52.

(2) A drain voltage detector 53 is connected between the drain current controller 52 and the column decoder 124. The drain voltage detector 53 detects the voltage applied to the drain D of each memory cell 101 or the associated bit line, and generates the detection signal W based on the detected voltage. The source voltage, drain current and gate voltage controllers 132, 52 and 134 operate in response to the detection signal W having a predetermined level from the drain voltage detector 53. The individual controllers 132, 52 and 134 control the voltages applied to the common source line SL, the bit line BLm and the word line WLm in the same manner as done in the prior art based on the L-level detection signal W. In accordance with the H-level detection signal W, the controllers 132, 52 and 134 set the voltages applied to those lines to the ground level.

Figure 17:
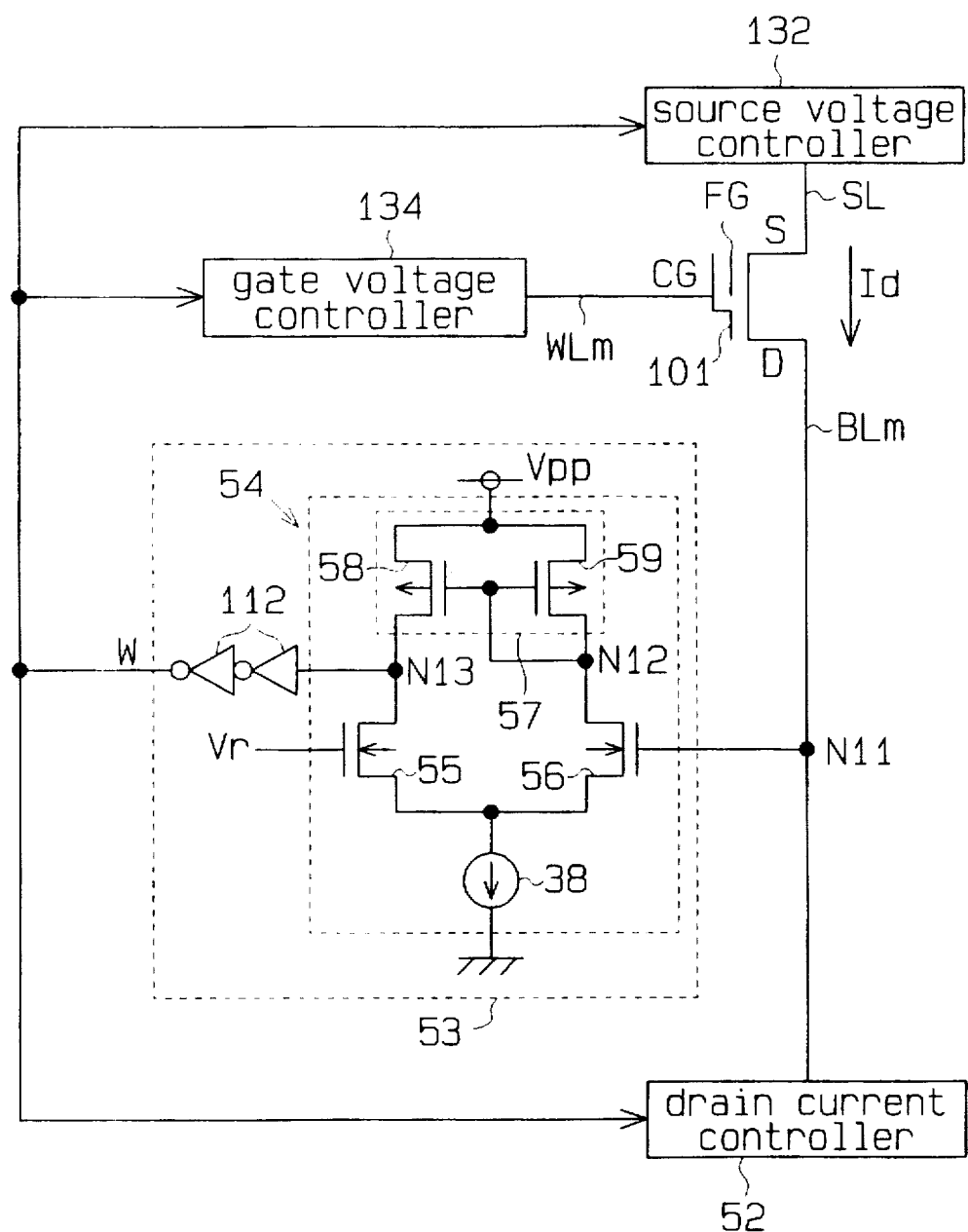
FIG. 17 is a block diagram illustrating a drain voltage detector in the flash EEPROM in FIG. 16.

As shown in FIG. 17, the drain voltage detector 53 includes a differential amplifier 54 and inverters 112. The differential amplifier 54 includes NMOS transistors 55 and 56, a current mirror type load 57 and the constant current source 38. The current mirror type load 57 is comprised of PMOS transistors 58 and 59. The differential amplifier 54 has a first input terminal (the gate of the NMOS transistor 56) connected via the column decoder 124 (not shown) to the associated bit line at the node N11, a second input terminal (i.e., the gate of the NMOS transistor 55) to which the constant voltage Vr is applied, and an output terminal (i.e., the drain of the NMOS transistor 55) connected to the two series-connected inverters 112 and the drain of the PMOS transistor 58 at the node N13.

At the node N12, the drain of the NMOS transistor 56 is connected to the gates of the transistors 58 and 59 and the drain of the PMOS transistor 59. The sources of the transistors 55 and 56 are grounded via the constant current source 38. The sources of the transistors 58 and 59 are connected to the internal voltage supply Vpp. The transistor 55 is designed larger in size than the transistor 56. Further, the transistor 58 is designed larger than the transistor 59. The transistors 55 and 56 may be designed to be the same size, and the transistors 58 and 59 may likewise be designed to be the same size. In this case, the amplification factor of the differential amplifier 54 will be "1". Preferably, the detection signal W from the drain voltage detector 53 is supplied to the individual controllers 132, 52 and 134 through the inverters 112.

The drain voltage detector 53 in the fourth embodiments detects the voltage at the drain D of each memory cell 101 or the voltage on the associated bit line, whereas the source voltage detector 33 in the third embodiment detects the voltage at the source S of each memory cell or the voltage on the common source line SL. The fourth embodiment can therefore have the same advantages as the third embodiment.

In the fourth embodiment, the detection signal W may be supplied only to the gate voltage controller 134. Further, the detection signal W may be supplied only to the source voltage controller 132. In this case, the source voltage controller 132 sets the voltage applied to the common source line SL to about +5 V or lower in accordance with the H-level detection signal W.

Although only several embodiments of the present invention have been described herein, it should be apparent to those skilled in the art that the present invention may be embodied in many other specific forms without departing from the spirit or scope of the invention. Particularly, it should be understood that the invention may be embodied in the following exemplary forms.

In the first to fourth embodiments, the split gate memory cells 201 shown in FIG. 4 may be used in place of the split gate memory cells 101. In this case, the source voltage controller 132 or the source current controller 32 could be omitted and the common source line SL could be grounded.

In the first to fourth embodiments, each flash EEPROM may further be provided with a source line decoder. The source line decoder is preferably connected to a plurality of source lines associated with each group of memory cells aligned in the row direction and selects one of the source lines according to the column address. Accordingly, the selected source line may be connected to the source voltage controller 132 or the source current controller 32.

In addition, the present invention may be adapted to a stacked gate flash EEPROM.

Further, this invention may be adapted to non-volatile semiconductor memory devices, such as FRAMs, EPROMs and EEPROMs, and semiconductor memory devices, such as DRAMs and SRAMs.

Therefore, the present examples and embodiments are to be considered as illustrative and not restrictive and the invention is not to be limited to the details given herein, but may be modified within the scope and equivalence of the appended claims.

What is claimed is:

1. A semiconductor memory device comprising:
   a plurality of memory cells;
   a write control unit for controlling voltages applied to said memory cells to write data in said memory cells; and
   a current detector, connected to said write control unit, for detecting a cell current flowing in each of said memory cells and controlling said write control unit based on said detected cell current value such that writing to said memory cells is permitted until desired data is rewritten in each memory cell.

2. The semiconductor memory device according to claim 1, wherein said current detector controls said write control unit to stop writing to said memory cells when said cell current value becomes equal to or smaller than a predetermined value.

3. The semiconductor memory device according to claim 1, wherein each of said memory cells has a gate, a source and a drain;
   wherein said write control unit includes,
      a source voltage controller for controlling a voltage applied to said source of each memory cell,
      a drain voltage controller for controlling a voltage applied to said drain of each memory cell, and
      a gate voltage controller for controlling a voltage applied to said gate of each memory cell; and
   wherein said current detector controls said source voltage controller, said drain voltage controller and said gate voltage controller until desired data is written in each memory cell.

4. The semiconductor memory device according to claim 1, wherein each of said memory cells has a gate, a source and a drain;
   wherein said write control unit includes,
      a source voltage controller for controlling a voltage applied to said source of each memory cell,
      a drain voltage controller for controlling a voltage applied to said drain of each memory cell, and
      a gate voltage controller for controlling a voltage applied to said gate of each memory cell; and wherein said current detector controls at least one of said source voltage controller, said drain voltage controller and said gate voltage controller to disable writing to said memory cells when said cell current value becomes equal to or smaller than a predetermined value.

5. The semiconductor memory device according to claim 1, wherein a plurality of written states of said memory cells are previously set in association with multi-values of multi-value data, a plurality of ranges for said cell current value are set in association with said plurality of written states, said current detector controls said write control unit to disable writing to said memory cells when said detected cell current value lies in a range associated with a written state of desired multi-value data.

6. The semiconductor memory device according to claim 1, wherein each of said memory cells has a gate, a source and a drain;

wherein said write control unit includes,
 a source voltage controller for controlling a voltage applied to said source of each memory cell,
 a drain voltage controller for controlling a voltage applied to said drain of each memory cell, and
 a gate voltage controller for controlling a voltage applied to said gate of each memory cell; and wherein said current detector controls at least one of said source voltage controller, said drain voltage controller and said gate voltage controller to disable writing to said memory cells when said detected cell current value lies in a range associated with a written state of desired multi-value data.

7. The semiconductor memory device according to claim 1, wherein said semiconductor memory device is a non-volatile semiconductor memory device, said memory cells are one of a split gate type and a stacked gate type, and said gate of each memory cell is a control gate.

8. A semiconductor memory device comprising:

a plurality of memory cells each having a plurality of terminals including a source and a drain;

a write control unit for controlling voltages applied to said plurality of terminals of said memory cells to write data in said memory cells; and a voltage detector, connected to said write control unit, for detecting a value of voltage at one of said source and said drain of each memory cell and controlling said write control unit based on said detected voltage value such that writing to said memory cells is permitted until desired data is rewritten in each memory cell.

9. The semiconductor memory device according to claim 8, wherein said voltage detector controls said write control unit to stop writing to said memory cells when said detected voltage value becomes equal to or smaller than a predetermined value.

10. The semiconductor memory device according to claim 8, wherein each of said memory cells has a gate, a source and a drain;

wherein said write control unit includes,
 a source current controller for controlling a current flowing in said source of each memory cell to control a voltage applied to said source of each memory cell,
 a drain voltage controller for controlling a voltage applied to said drain of each memory cell, and
 a gate voltage controller for controlling a voltage applied to said gate of each memory cell; and wherein said voltage detector detects a value of voltage at said source of each memory cell and controls said source current controller, said drain voltage controller and said gate voltage controller such that writing to said memory cells is permitted until desired data is written in each memory cell.

11. The semiconductor memory device according to claim 8, wherein each of said memory cells has a gate, a source and a drain;

wherein said write control unit includes,
 a source current controller for controlling a current flowing in said source of each memory cell to control a voltage applied to said source of each memory cell,
 a drain voltage controller for controlling a voltage applied to said drain of each memory cell, and
 a gate voltage controller for controlling a voltage applied to said gate of each memory cell; and wherein said voltage detector detects a value of voltage at said source of each memory cell and controls at least one of said source current controller, said drain voltage controller and said gate voltage controller to disable writing to said memory cells when said detected voltage value at said source becomes equal to or smaller than a predetermined value.

12. The semiconductor memory device according to claim 8, wherein each of said memory cells has a gate, a source and a drain;

wherein said write control unit includes,
 a source voltage controller for controlling a voltage applied to said source of each memory cell,
 a drain current controller for controlling a current flowing in said drain of each memory cell to control a voltage applied to said drain of each memory cell, and
 a gate voltage controller for controlling a voltage applied to said gate of each memory cell; and wherein said voltage detector detects a value of voltage at said source of each memory cell and controls at least one of said source voltage controller, said drain current controller and said gate voltage controller to disable writing to said memory cells when said detected voltage value at said drain becomes equal to or smaller than a predetermined value.

13. The semiconductor memory device according to claim 8, wherein a plurality of written states of said memory cells are previously set in association with multi-values of multi-value data, a plurality of ranges for said voltage value at one of said drain and said source are set in association with said plurality of written states, said voltage detector controls said write control unit to disable writing to said memory cells when said detected voltage value lies in a range associated with a written state of desired multi-value data.

14. The semiconductor memory device according to claim 13, wherein each of said memory cells has a gate, a source and a drain;

wherein said write control unit includes,
 a source current controller for controlling a current flowing in said source of each memory cell to control a voltage applied to said source of each memory cell,
 a drain voltage controller for controlling a voltage applied to said drain of each memory cell, and
 a gate voltage controller for controlling a voltage applied to said gate of each memory cell; and wherein said voltage detector detects a value of voltage at said source of each memory cell and controls at least one of said source current controller, said drain voltage controller and said gate voltage controller to disable writing to said memory cells when said detected voltage value at said source lies in a range associated with a written state of desired multi-value data.

15. The semiconductor memory device according to claim 13, wherein each of said memory cells has a gate, a source and a drain;

wherein said write control unit includes,
- a source voltage controller for controlling a voltage applied to said source of each memory cell,
- a drain current controller for controlling a current flowing in said drain of each memory cell to control a voltage applied to said drain of each memory cell, and
- a gate voltage controller for controlling a voltage applied to said gate of each memory cell; and wherein said voltage detector detects a value of voltage at said source of each memory cell and controls at least one of said source voltage controller, said drain current controller and said gate voltage controller to disable writing to said memory cells when said detected voltage value at said drain lies in a range associated with a written state of desired multi-value data.

16. The semiconductor memory device according to claim 8, wherein said semiconductor memory device is a non-volatile semiconductor memory device, said memory cells are one of a split gate type and a stacked gate type, and said gate of each memory cell is a control gate.

* * * * *